United States Patent [19]
Cooperman et al.

[11] Patent Number: 5,285,202
[45] Date of Patent: Feb. 8, 1994

[54] BROADBAND SWITCH USING DEACTIVATED CROSSPOINTS FOR ESTABLISHING SWITCHING PATHS

[75] Inventors: Michael Cooperman, Framingham; Richard W. Sieber, Attleboro; Arnold Paige, Natick, all of Mass.

[73] Assignee: GTE Laboratories Incorporated, Waltham, Mass.

[21] Appl. No.: 808,032

[22] Filed: Dec. 11, 1991

Related U.S. Application Data

[63] Continuation of Ser. No. 347,370, May 4, 1989, abandoned.

[51] Int. Cl.$^5$ .............................................. H04Q 1/00
[52] U.S. Cl. ............................. 340/825.8; 340/825.87; 340/825.02
[58] Field of Search ........... 340/825.8, 825.79, 825.85, 340/825.87, 825.02, 826, 825.91; 370/112; 307/243; 328/104

[56] References Cited

U.S. PATENT DOCUMENTS

| | | | |
|---|---|---|---|
| 3,614,327 | 10/1971 | Low | 370/112 |
| 4,197,428 | 4/1980 | Semur . | |
| 4,453,096 | 6/1984 | Le Can et al. | 307/243 |
| 4,481,623 | 11/1984 | Clark | 340/825.02 |
| 4,593,390 | 6/1986 | Hildebrand et al. | 370/112 |
| 4,813,043 | 3/1989 | Reyneri | 370/112 |
| 4,818,988 | 4/1989 | Cooperman et al. | 340/825.85 |
| 4,849,751 | 7/1989 | Barber et al. | 340/825.02 |
| 4,970,507 | 11/1990 | Cooperman et al. | 340/825.8 |
| 5,049,877 | 9/1991 | Cooperman et al. | 340/825.8 |

FOREIGN PATENT DOCUMENTS

| | | |
|---|---|---|
| 396119 | 7/1990 | European Pat. Off. . |
| 2388447 | of 1978 | France . |
| 60-201795 | 2/1986 | Japan . |
| 61-65623 | 8/1986 | Japan . |
| 1-158891 | 9/1989 | Japan . |

OTHER PUBLICATIONS

Panzer et al., "Picture transmission path . . . subscriber network," Frequenz, vol. 38, No. 9, 1984, pp. 217-223.

Suzuki et al., "A Circuit Design for . . . Switch LSI's," IEEE J. of Solid-State Circuits, vol. 25, No. 1, pp. 155-159 (1990).

IBM Tech. Disclosure Bull. "CMOS Self-Decoding Complementary Pass-Gate Multiplexer", vol. 28, No. 3 (Aug. 1985) pp. 1302-1303.

"Logic Design", Holdsworth et al., Wireless World, vol. 84, No. 1507, (Mar. 1978), pp. 47-50.

N. H. E. Weste et al., "CMOS Circuit and Logic Design," Prin. of CMOS VLSI Design, pp. 172-203 (1985).

(List continued on next page.)

Primary Examiner—Donald J. Yusko
Assistant Examiner—Edwin C. Holloway, III
Attorney, Agent, or Firm—Victor F. Lohmann, III

[57] ABSTRACT

A broadband space switch matrix constructed from a plurality of NAND gates arranged into a set of cascaded stages to form a tree-switch multiplexing configuration. A plurality of input digital signals are applied to input ports coupled to the NAND gates in the first stage. A selected one of the input signals emerges as an output signal from an output port coupled to a single NAND gate in the last stage. Each NAND gate has a select line for receiving control signals. The switching path for the selected input signal is established by placing the sequence of NAND gates defined by the selected switching path in a state of conduction whereby only the selected input signal propagates through the switch. This is effected by forcing to a HIGH state the particular NAND gates in each stage whose outputs are coupled to the same NAND gate in the following stage along with the output of the NAND gate in the current stage which is in the chosen path. The forced HIGH state is achieved by applying a LOW state signal to the respective select lines of the particular NAND gates. In an alternate arrangement, the NAND gates in the first stage are replaced by 2:1 pass-transistor-selectors which offer a reduction in the number of transistors.

24 Claims, 2 Drawing Sheets

OTHER PUBLICATIONS

Pasternak et al., "CMOS Differential Pass-Transistor Logic Design", IEEE Journal of Solid State Circuits, vol. SC-22 No. 2, pp. 216–222 (1987) Apr.

Hayano et al., "GaAs 8×8 Matrix Switch LSI for High-Speed Digital Communications," IEEE Gallium Arsenide IC Symposium, pp. 245–248 (Oct. 1987).

S, Whitaker, "Pass-Transistor Networks Optimize n-MOS Logic", Elec., vol. 56, No. 19, pp. 144–148 (Sep. 1983).

F. E. Barber et al., "Session IX: Telecommunication Circuits" IEEE Intl. Solid-State Circuits Conf. 1988 pp. 116–117.

BROADBAND SWITCH USING DEACTIVATED CROSSPOINTS FOR ESTABLISHING SWITCHING PATHS

This is a continuation of copending application(s) Ser. No. 07/347,370 filed on May 4, 1989, now abandoned.

CROSS REFERENCE TO RELATED APPLICATIONS

This application is related to a copending application entitled "BROADBAND SWITCH MATRIX WITH NON-LINEAR CASCADING," Ser. No. 07/626,340, filed Dec. 13, 1990 and issued Sep. 17, 1991 and U.S. Pat. No. 5,049,877, which is a continuation of Ser. No. 07/324,845, filed Mar. 17, 1989, now abandoned, and to copending application entitled "BROADBAND TREE SWITCHES USING IDENTICAL GATES IN CASCADE TO REDUCE PULSE WIDTH NARROWING," Ser. No. 759,731 filed Sep. 12, 1991, and issued Dec. 8, 1992 as U.S. Pat. No. 5,170,160, which is a continuation of Ser. No. 07/351,632, filed May 9, 1989 now abandoned, all of said applications being filed by the same inventors and assigned to the same assignee as this application.

FIELD OF THE INVENTION

This invention relates to broadband space switch matrices and, more particularly, to a tree-switch configuration which establishes the switching path for a selected input signal while blocking the switching paths of the remaining unwanted input signals.

BACKGROUND OF THE INVENTION

There is a major effort in the communication industry to add broadband video services to the telephone network. For technical and economic reasons, the transmitted video will most likely be in digital form, requiring a data rate of over 100 Mb/s. Since this high information rate is a thousand-fold greater than that of digitized voice, it will require techniques that emphasize high-speed performance.

Although optical switching has great switching potential, it is not yet ready for deployment. Consequently, electronic switching will be utilized in the first introduction of broadband video. The industry is focusing on CMOS space switching as the most straightforward broadband switching technique due to its high speed, high density, and low power dissipation. However, conventional broadband space switches reported have been limited to predominantly 16×16 arrays. As the size of the arrays is increased, the switching speed decreases due to a geometric increase in crosspoints and associated parasitic elements.

The aforementioned copending application discloses a broadband switch array as shown in FIG. 1 that attempts to reduce the aforementioned problem of stray capacitances by connecting the rows to each column with a tree structure as opposed to a direct connection. The matrix in FIG. 1 is basically a parallel combination of multiplexers each connected to the same input lines. The multiplexing operation is accomplished with a plurality of cascaded stages arranged into a tree configuration 78 wherein each stage is comprised of 2:1 selector elements 73.

OBJECTS OF THE INVENTION

Accordingly, it is a primary object of this invention to obviate the above noted and other disadvantages of the prior art.

It is a further object of this invention to provide a broadband space switch array that operates to establish a switching path for a selected input signal while preventing the other unwanted input signals from traversing the switch array.

It is a further object of this invention to provide a broadband space switch array which achieves maximum operating speed and minimizes propagation delay.

SUMMARY OF THE INVENTION

In one aspect of the invention a broadband space switch matrix receives a plurality of input signals through input ports and provides a selected one of said signals through an output port. The matrix is constructed from a plurality of NAND gates arranged into a set of cascaded stages to form a multiplexing tree configuration wherein the input ports are coupled to the first stage NAND gates and the output port is coupled to a single NAND gate in the last stage. Each NAND gate has input lines, an output, and a select line. The stages are interconnected so that each NAND gate output from one stage drives a single NAND gate input of a following stage. A means for establishing a desired switching path connects a selected one of the input ports to the output port so that only the input signal applied to said selected input port propagates through the sequence of NAND gates defined by the chosen path. The establishing means includes means for forcing to a HIGH state the particular NAND gates in each stage whose outputs are coupled, along with the output carrying the selected signal, to the same NAND gate in the next stage. The forcing means is effected by placing a LOW state logic signal on the respective select lines of the particular NAND gates. Due to said forcing means, the array operates to allow the selected input signal to propagate through each stage while concurrently preventing the other unwanted input signals entering the first stage from proceeding through the array.

In another aspect of the present invention, the first stage of the above-described broadband switch matrix is constructed from 2:1 pass-transistor-selectors instead of NAND gates. All succeeding stages are likewise implemented with NAND gates.

DETAILED DESCRIPTION OF THE PREFERRED EMBODIMENT

Figure 2:
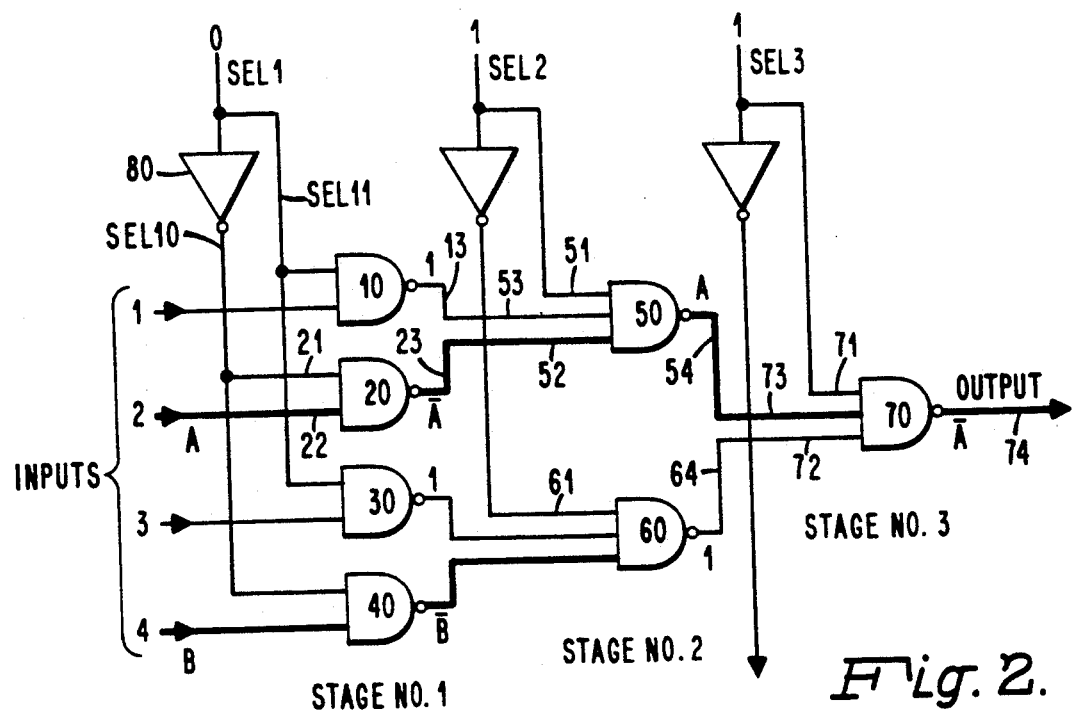
FIG. 2 is a diagram of a broadband tree-switch in accordance with one embodiment of the present invention.

FIG. 2 shows a broadband space switch in accordance with one embodiment of the present invention in which a selected switching path is established to allow only a particular input signal to propagate through the switch and emerge as an output signal. Although the invention is illustrated for exemplary purposes as a 4×1 switch, the switch can be expanded to include any number of inputs. In order to accommodate multiple outputs, such as in an M×N switch, the desired switch array is formed by driving N M×1 switch arrays in parallel. Further expansion is possible by driving multiple M×N arrays in parallel.

Referring to the construction of the switch in FIG. 2, four input ports 1, 2, 3, and 4 are connected to four 2-input NAND gates 10, 20, 30, and 40, respectively, in stage No. 1 wherein each input port drives a single one of the NAND gates. The output lines from these first stage NAND gates are connected in pairs to the input lines of two 3-input NAND gates 50 and 60 in the next stage No. 2. The outputs from gates 50 and 60 are coupled to the inputs of NAND gate 70 in stage No. 3. The output 74 from gate 70 serves as the output port of the 4×1 switch. The select input ports SEL1, SEL2, and SEL3 provide select signals to the NAND gates in stages No. 1, No. 2, and No. 3, respectively, where, for example, select input port SEL1 provides a non-inverted select signal on select line SEL11 and an inverted signal, due to inverter 80, on select line SEL10. The 3-bit combination of select input signals applied to the select input ports determines which switching path is established between the input ports and the output port.

In general, each NAND gate in stage No. 1 has a first input connected to one of the input ports, a second input serving as a select input connected to one of the select lines associated with that stage, and an output coupled to an input of a NAND gate in the following stage. For example, NAND gate 20 has a first input 22 coupled to input port 2, a select input 21 connected to select line SEL10, and an output 23 coupled to input 52 of gate 50. The remaining stages No. 2 and No. 3 are each constructed from three-input NAND gates having a first input coupled to an output of a NAND gate in the preceding stage, a second input coupled to the output of another NAND gate in the preceding stage, a third input serving as a select input connected to one of the two select lines associated with that stage, and an output. For example, NAND gate 50 has a first input 53 coupled to output 13 of gate 10, a second input 52 coupled to output 23 of gate 20, a select input 51 connected to the non-inverting select line from select input port SEL2, and an output 54 coupled to input 73 of gate 70.

As indicated, the interconnection between adjacent stages is provided by connecting in pairs the outputs from one stage to the inputs of the next stage. The result is that each of the outputs drives only one NAND gate input, thereby maximizing propagation speed.

The connectivity between the select input of each NAND gate in a particular stage to either the non-inverted or inverted select line associated with that stage is made in the following manner. For those gates in the same stage whose outputs are paired for connection to the same NAND gate in a following stage, one of the gates will have its select input connected to the non-inverted select line while the other gate will have its select input connected to the inverted select line.

The novelty of the present invention, as will be explained in the following discussion of the operation of the switch in FIG. 2, lies in the selection and subsequent establishment of a desired switching path by forcing the appropriate NAND gates, according to the requirements described hereinbelow, into a logical HIGH state to effect the establishment of the selected path. The switching path connecting one of the input ports 1, 2, 3, or 4 to output 74 of gate 70 is selected by applying an appropriate combination of control signals to the select input ports SEL1, SEL2, and SEL3 so that the NAND gates in the array will establish the selected switching path. For exemplary purposes, assume that the digital signal applied to input 2 is chosen to propagate through the switch array. As indicated, the signal must traverse NAND gates 20, 50, and 70 before reaching output 74. The signals applied to the select lines must therefore block the unwanted input signals entering input ports 1, 3, and 4 from reaching the output port while allowing the signal entering input port 2 to propagate through the switch.

In order for signal A to propagate through each stage along the selected path, each of the NAND gates 20, 50, and 70 must be placed in an enabling condition which makes these NAND gates operable to undergo switching so that when signal A enters each of these NAND gates, it is coupled to the respective output of the NAND gate and is thereby made available for propagation to the next stage. The enabling condition for each NAND gate in the selected path is established by placing each of its inputs, other than the one carrying the selected input signal, in a logical HIGH state. In the present invention, the enabling condition for each NAND gate in the chosen path is achieved by (1) forcing to a logical HIGH state the particular NAND gates in each stage whose outputs are coupled to the same NAND gate in the next stage along with the output of the NAND gate in the current stage which is in the path, and (2) applying a HIGH state select signal to the select input of each NAND gate in the path. Specifically, the output of gate 10 (whose output is paired with gate 20) and the output of gate 60 (whose output is paired with gate 50) are forced to a logical HIGH state by applying a LOW state signal to their respective select inputs. Accordingly, the switching path for input 2 is established by applying a LOW state logic signal, a HIGH state logic signal, and a HIGH state logic signal to select input ports SEL1, SEL2, and SEL3, respectively.

The overall effect of forcing the appropriate NAND gates into a logical HIGH state is to allow the digital signal present at the selected input port to propagate through each stage and appear at the output port while at the same time preventing signals present at the other input ports from reaching the output port. The operation of the 4×1 switch in FIG. 2 in response to the select signals is described hereinbelow.

In stage No. 1, the LOW state select signal applied to SEL1 places a HIGH state signal on input line 21 of gate 20, thereby enabling signal A to appear on output 23 in an inverted state. The LOW state signal on SEL1 also places the signal B entering input port 4 on the output of gate 40 in an inverted state while forcing the outputs of gates 10 and 30 to a logical HIGH state, thereby preventing the input signals present at input ports 1 and 3 from proceeding through the switch array.

In stage No. 2, the HIGH state select signal applied to SEL2 places a HIGH state signal on the input 51 and forces the output of gate 60 to a HIGH state by coupling a LOW state signal to select input 61. Forcing gate 60 to a HIGH state is necessary since the outputs from gates 50 and 60 are paired for connection to the same gate 70 in the following stage No. 3. The HIGH state signal on output 64 is coupled to input 72 of NAND gate 70 while signal A propagates from output 54 to input 73 of gate 70. In stage No. 3, the HIGH state signal applied to SEL3 enables gate 70 and thereby couples signal Ā to output 74.

Figure 1:
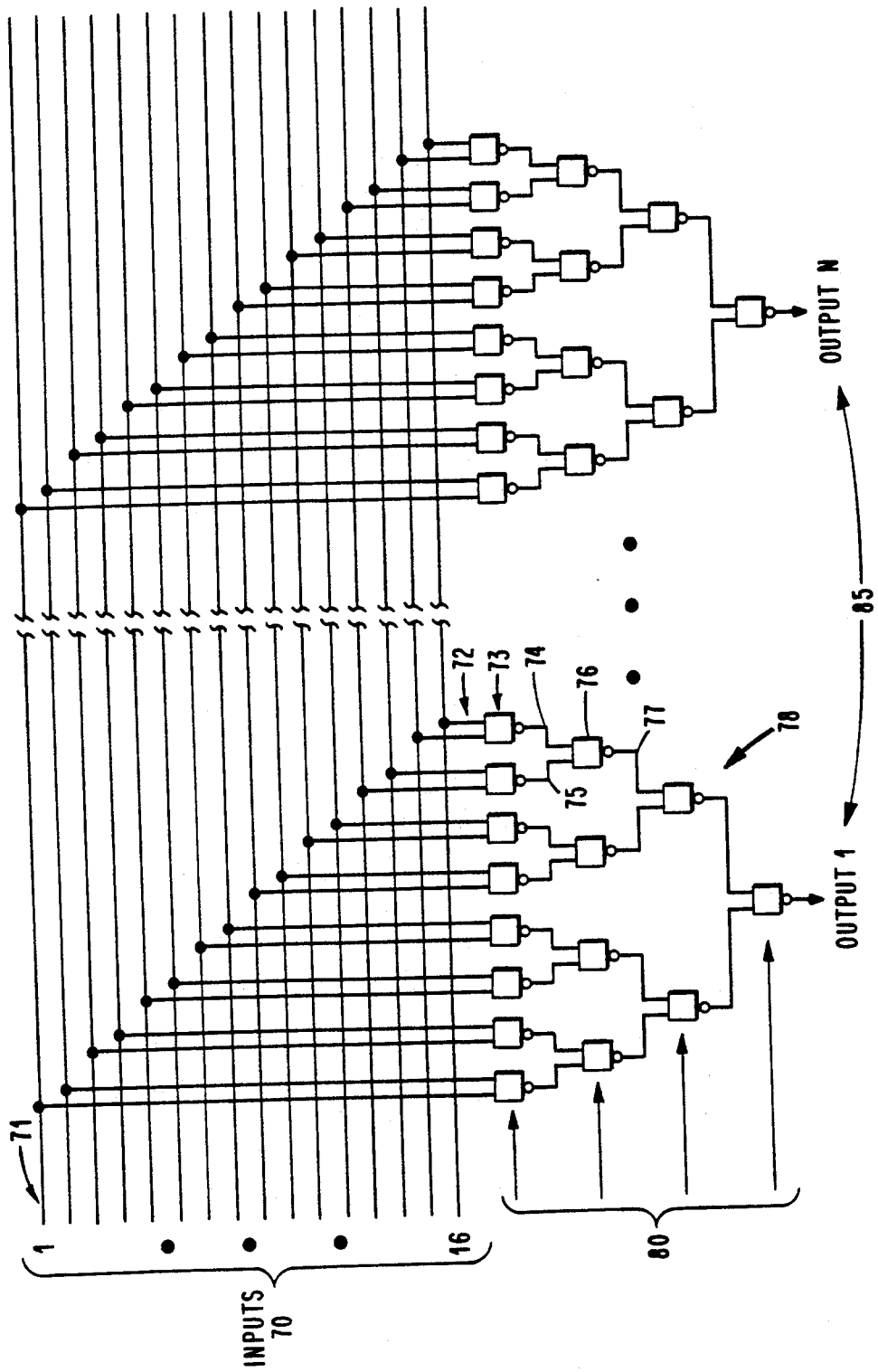
FIG. 1 is a diagram of a broadband space switch array disclosed in a copending application and is discussed hereinabove.

The present invention as disclosed in the embodiment of FIG. 2 implements the cascaded stages with NAND gates. Although NAND gates are preferred over pass-transistor-selectors (FIG. 1) since they are the fastest gate in the CMOS family, the disadvantage is an almost doubling in the number of transistors with a corresponding increase in chip area. In switch arrays similar to that shown in FIG. 2 when other binary logic circuits are used to implement the switch, the establishment of a selected switching path can still be accomplished by forcing gates into a particular logic state according to the requirements described hereinbefore. In general, these binary logic circuits will have control input means, input lines, and an output line for switchably coupling a signal on one of the input lines to the output line.

Figure 3:
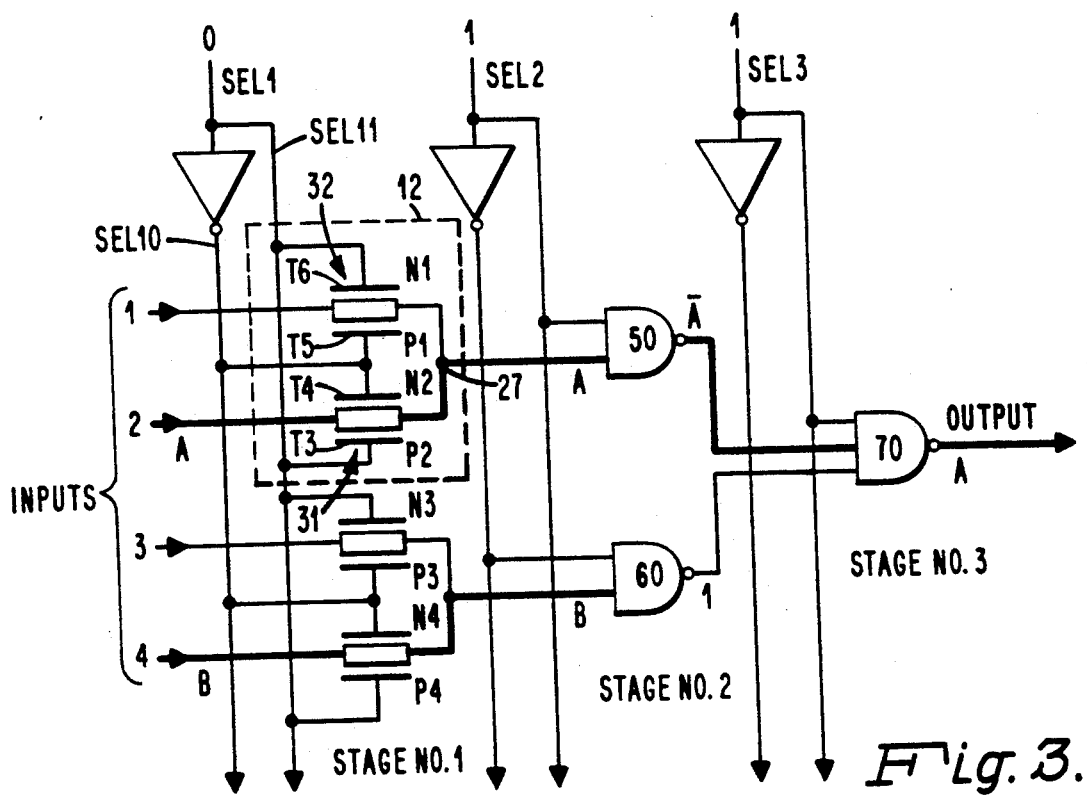
FIG. 3 is a diagram of a preferred embodiment of the present invention having improvements to the array of FIG. 2.

A preferred embodiment of the present invention is shown in FIG. 3 where a 4×1 switch is again used to illustrate the operation of the switch. The switch in FIG. 3 differs from that of FIG. 2 by using 2:1 pass-transistor-selectors 12 instead of NAND gates in stage No. 1. All succeeding stages are likewise implemented with NAND gates.

One configuration of a selector 12, as shown in FIG. 3, includes a first switch 31 of a complementary pair of a P-type and an N-type MOS field effect transistor T3 and T4, respectively, connected in parallel between the input port 2 and a common juncture 27. A second switch 32 of a complementary pair of a P-type and an N-type MOS field effect transistor T5 and T6, respectively, are connected in parallel between input port 1 and the common juncture 27. The gate of the P-type transistor T3 of the first switch 31 and the gate of the N-type transistor T6 of the second switch 32 are connected together and to a first control input connection coupled to the non-inverted select line of select input port SEL1. The gate of the N-type transistor T4 of the first switch 31 and the gate of the P-type transistor T5 of the second switch 32 are connected in common to a second control input connection coupled to the inverted select line of select input port SEL1.

The 2:1 pass-transistor selector operates in the following manner. When a HIGH state logic signal is present on SEL1, and therefore a LOW state logic signal is present on SEL10, the transistors T3 and T4 of the first switch 31 are biased to the non-conducting or off condition, thereby providing an open switch between input port 2 and juncture 27. These same select signals bias the transistors T5 and T6 of the second switch 32 to the on or conducting condition so that a closed switch is provided between input port 1 and juncture 27. Thus, the digital signal present at input port 1 is selected to propagate through the selector 12 and thereby becomes available for propagation to the next stage.

Alternatively, when the signal on SEL1 is in a logical LOW state and the signal on SEL10 is therefore in a logical HIGH state, transistors T5 and T6 of the second switch 32 are biased to provide an open condition between input port 1 and the juncture 27, and transistors T3 and T4 of the first switch 31 are biased to provide a closed condition between input port 2 and the juncture 27. Thus, the digital signal present at input port 2 is placed on the output of selector 12 and is thereby available for propagation to stage No. 2.

The remaining stages No. 2 and No. 3 are implemented with NAND gates in a fashion similar to that of the switch in FIG. 2. However, 2-input NAND gates are used in stage No. 2 instead of 3-input gates as in FIG. 2 since the set of 2:1 selectors provides half the number of signals to stage No. 2 as the set of NAND gates in stage No. 1 of FIG. 2. In general, the same combination of select signals in FIG. 2 are applied to select input ports SEL1, SEL2, and SEL3 to establish the same switching path. For example, in response to the indicated control signals present at the select input ports for switching signal A, selector 12 couples signal A to the input of gate 50, gate 50 couples signal A to gate 70, gate 60 is forced to a HIGH state (just as in FIG. 2) since its output is coupled with the output of gate 50, and gate 70 is enabled to permit signal A to appear at the output port.

What has been shown and described herein are two embodiments of a novel tree-switch architecture in which switching is accomplished by establishing a selected switching path while concurrently blocking the other unwanted switching paths. Specifically, the application of an appropriate combination of control signals to the binary logic circuits in the switch forces the logic circuits into appropriate operating states whereby only the path corresponding to a selected input signal is established. The preferred embodiment using 2:1 pass-transistor-selectors in the first stage provides nearly the same speed as the embodiment using NAND gates while additionally minimizing the number of transistors. Since the NAND gates in stage No. 1 of FIG. 2 comprise over half the area of the switch, minimizing the transistor count is a major benefit. Although the pass-transistor-selector is somewhat slower, its effect is negligible because it is used in the first stage which is driven from a high-power external driver. Consequently, the present invention increases propagation speed as a result of the implementation with "fast" logic circuits (NAND gates in the disclosed CMOS switches) and the minimization of transistor area. The reduction in area minimizes propagation delay due to shorter connections associated with fewer numbers of transistors. The advantage of having shorter connection lengths, which is not the case in the prior art switch of FIG. 1 because the connection lengths increase rapidly with the number of stages N, enables a further increase in speed.

The architectures according to the present invention are not limited to CMOS implementation, and hence the means for establishing a desired switching path in accordance with the requirements described hereinabove accompanying the embodiments of FIGS. 2 and 3 are applicable to other switch configurations which utilize different binary logic circuits that are appropriate for the particular technology. For example, a technology which implements a NAND function with a cascaded sequence of a NOR and AND gate might be a more advantageous design, but this embodiment still falls within the scope of the present invention since a switching path is established in the same manner as set forth in the appended claims and the supporting specification. Because CMOS is the preferred technology for the switch array disclosed herein, the use of NAND gates is determined by the fact that the fastest gate in CMOS is the NAND gate.

What is claimed is:

1. A switch for receiving a plurality of input data signals through input ports and providing one of said signals as an output signal through an output port, comprising:

a plurality of NAND gates arranged into a multi-stage tree-multiplexer, said tree-multiplexer being coupled at a first stage to the input ports and coupled at a last stage to the output port;

each of said stages having a respective select means associated therewith for receiving a select signal and providing as control signals on respective select lines an inverting and non-inverting version of said select signal;

wherein the NAND gates in said first stage each having a control line coupled to one of the select lines of the select means associated with said first stage, an input line connected to a corresponding one of said input ports, and an output line;

wherein each NAND gate in the stages after the first stage and before the last stage having a control line coupled to one of the select lines of the select means associated with said stage, a first and second input line each connected to a different NAND gate output line from the preceding state, and an output line driving a respective input line of a NAND gate in a next stage; and wherein the last stage includes a single NAND gate having a control line coupled to one of the select lines of the select means associated with said last stage, a first and second input line each connected to a different NAND gate output line from the preceding stage, and an output line coupled to said output port;

said switch being operable in response to an appropriate combination of select signals to establish a desired switching path through said switch by rendering each NAND gate in said desired path operable to undergo switching;

whereby each particular NAND gate not in said switching path whose respective output drives, in a next stage, a NAND gate in said desired path is forced to a logical steady-state HIGH output.

2. The switch as recited in claim 1 wherein each of said select means includes:
an inverter having an input to receive said select signal and an output coupled to one of said select lines for providing the inverted version of said select signal.

3. A switch for receiving a plurality of input data signals through input ports and providing one of said signals as an output signal through an output port, comprising:

a plurality of binary switching circuits arranged into a multi-stage tree-multiplexer, wherein a first stage of said tree-multiplexer receives said input data signals and a last stage includes a single binary switching circuit coupled at an output line thereof to said output port;

each of said stages having a respective select means associated therewith for receiving a select signal and providing as control signals on respective select lines an inverting and non-inverting version of said select signal;

each binary switching circuit before the last stage having control means coupled to the select means associated with said respective stage for receiving control signals therefrom, input lines, and an output line driving a respective input line of a switching circuit in a next stage;

wherein the single binary switching circuit in said last stage having control means coupled to the select means associated with said last stage for receiving control signals therefrom, input lines, and said output line coupled to said output port;

each of said binary switching circuits being operable to undergo switching in response to a first select signal at the associated control means whereby a signal present on one of the associated input lines is placed at the output thereof when a first logic state signal is present on each of the other of said associated input lines; and said switch being operable in response to an appropriate combination of select signals to establish a desired switching path through said switch by rendering each binary switching circuit in said desired path operable to undergo switching;

whereby each particular switching circuit not in said switching path whose respective output drives, in a next stage, a switching circuit in said desired path is forced to a first logical steady-state output.

4. The switch as recited in claim 3 wherein each of said select means includes:
an inverter having an input to receive said select signal, and an output coupled to one of said select lines for providing the inverted version of said select signal.

5. The switch as recited in claim 3 wherein:
each binary switching circuit in said first stage being a NAND gate with a single input line; and
the binary switching circuits in each stage after the first stage being a NAND gate with two input lines.

6. The switch as recited in claim 3 wherein:
said first logic state being a HIGH state; and
said first select signal being a HIGH state signal.

7. A switch for receiving a plurality of input data signals through input ports and providing one of said signals as an output signal through an output port, comprising:

a selection stage comprising a plurality of pass-transistor selector means each having at least two inputs each connected to a respective input port, an output, and control input means for selectively coupling one of said inputs to said output;

a plurality of NAND gates arranged into a multi-stage tree-multiplexer, said tree-multiplexer being coupled at a first stage to the selection stage and coupled at a last stage to the output port;

said selection stage and the stages of said tree-multiplexer each having a respective select means associated therewith for receiving a select signal and providing as control signals on respective select lines an inverting and non-inverting version of said select signal, wherein the control input means of each pass-transistor selector means is coupled to the select means associated with said selection stage for receiving control signals therefrom;

wherein the NAND gates in said first tree-multiplexer stage each having a first input connected to the output of a respective one of said pass-transistor selector means, a control line coupled to one of the select lines of the select means associated with said stage, and an output wherein the output of each pass-transistor selector means drives only one NAND gate input line in the first stage of said tree multiplexer;

wherein each NAND gate in the tree-multiplexer stages after said first stage and before the last stage having a first and second input each connected to a respective NAND gate output line from the preceding stage, a control line coupled to one of the select lines of the select means associated with said stage for receiving control signals therefrom, and an output driving a respective input of a NAND gate in a next stage; and wherein the last stage includes a single NAND gate having a first and second input each connected to a respective NAND gate output line from the preceding stage, a control line coupled to one of the select lines of the select means associated with said stage for receiving control signals therefrom, and an output coupled to said output port;

said switch being operable in response to an appropriate combination of select signals to establish a desired switching path through said switch by selectively coupling one of the inputs of a respective selector means to the output thereof, and by rendering each NAND gate in said desired path operable to undergo switching;

whereby each particular NAND gate not in said switching path whose respective output drives, in a next state, a NAND gate in said desired path is forced to a logical steady-state HIGH output.

8. The switch as recited in claim 7 wherein each of said select means includes:

an inverter having an input to receive said select signal, and an output coupled to one of said select lines for providing the inverted version of said select signal.

9. The switch as recited in claim 7 wherein:

said pass-transistor selector means having a first input and a second input;

said pass-transistor selector means being operable in response to a first control condition at the control input means to provide a closed circuit condition between the first input and the output thereof and an open circuit condition between the second input and the output thereof; and said pass-transistor selector means being operable in response to a second control condition at the control input means to provide an open circuit condition between the first input and the output thereof and a closed circuit condition between the second input and the output thereof.

10. A switch array in accordance with claim 7 wherein said pass-transistor selector means includes first switching means having an input connected to the first input of the pass-transistor selector means and having an output;

second switching means having an input connected to the second input of the pass-transistor selector means and having an output;

said first switching means being coupled to said control input means; said first switching means being biased in a closed condition when the first control condition is present at said control input means, and being biased in an open condition when the second control condition is present at said control input means; and said second switching means being coupled to said control input means; said second switching means being biased in an open condition when the first control condition is present at said control input means, and being biased in a closed condition when the second control condition is present at said control input means.

11. A switch array in accordance with claim 10 wherein said first switching means includes a first row switching transistor connected between the first input and the output of said associated pass-transistor selector means and a second row switching transistor, complementary to said first row switching transistor, connected between the first input and the output of said associated pass-transistor selector means in parallel with said first row switching transistor;

said second switching means includes a third row switching transistor connected between the second input and the output of said pass-transistor selector means and a fourth row switching transistor, complementary to said third row switching transistor, connected between the second input and the output of said pass-transistor selector means in parallel with said third row switching transistor;

said first row switching transistor and said fourth row switching transistor being complementary transistors and each having a control electrode connected in common to a first control input connection;

said second row switching transistor and said third row switching transistor having complementary transistors and each having a control electrode connected in common to a second control input connection;

said first and second row switching transistors being biased for conduction therethrough and said third and fourth row switching transistors being biased to nonconduction when a first voltage level is present at said first control input connection and a second voltage level is present at said second control input connection; and said third and fourth row switching transistors being biased for conduction therethrough and said first and second row switching transistors being biased to nonconduction when said second voltage level is present at said first control input connection and said first voltage level is present at said second control input connection;

whereby when said first voltage level is present at said first control input connection and said second voltage level is present at said second control input connection, digital signals present at said first input are coupled to said pass-transistor selector means output; and whereby when said second voltage level is present at said first control input connection and said first voltage level is present at siad second control input connection, digital signals present at said second input are coupled to said pass-transistor selector means output.

12. A switch for receiving a plurality of input data signals through input ports and providing one of said signals as an output signal through an output port, comprising:

a selection stage comprising a plurality of pass-transistor selector means each having at least two inputs each connected to a respective input port, an output, and control input means for selectively coupling one of said inputs to said output;

a plurality of binary switching circuits arranged into a multi-stage tree-multiplexer, wherein a first stage of said tree-multiplexer is coupled to the outputs of said selector means, and a last stage includes a single binary switching circuit coupled to said output port;

each of said binary switching circuits having control input means, input lines, and an output line wherein each selector means output line drives a single input line of a corresponding binary switching circuit in said first stage of said multiplexing tree, and wherein the output line of each binary switching circuit before the last stage drives a respective input line of a binary switching circuit in a next stage, and wherein the output line of the single binary switching circuit in said last stage is coupled to said output port;

said selection stage and the stages of said tree-multiplexer each having a respective select means associated therewith for receiving a select signal and providing as control signals on respective select lines an inverting and non-inverting version of said select signal, wherein the control input means of each pass-transistor selector means and each binary switching circuit is coupled to the select means associated with said respective stage for receiving control signals therefrom;

each of said binary switching circuits being operable to undergo switching in response to a first select signal at the associated control input means whereby a signal present on one of the associated input lines is placed at the output thereof when a first logic state signal is present on each of the other of said associated input lines; and said switch being operable in response to an appropriate combination of select signals to establish a desired switching path through said switch by selectively coupling one of the inputs of a respective selector means to the output thereof, and by rendering each binary switching circuit in said desired path operable to undergo switching;

whereby each particular switching circuit not in said switching path whose respective output drives, in a next stage, a switching circuit in said desired path is forced to a first logical steady-state output.

13. The switch as recited in claim 12 wherein each of said select means includes:
an inverter having an input to receive said select signal, and an output coupled to one of said select lines for providing the inverted version of said select signal.

14. The switch as recited in claim 12 wherein:
said pass-transistor selector means having a first input and a second input;
said pass-transistor selector means being operable in response to a first control condition at the control input means to provide a closed circuit condition between the first input and the output thereof and an open circuit condition between the second input and the output thereof; and
said pass-transistor selector means being operable in response to a second control condition at the control input means to provide an open circuit condition between the first input and the output thereof and a closed circuit condition between the second input and the output thereof.

15. The switch as recited in claim 12 wherein each binary switching circuit being a NAND gate.

16. The switch as recited in claim 12 wherein said first logic state being a HIGH state; and said first select signal being a HIGH state signal.

17. A switch, comprising:
a plurality of switching means configured as a multistage tree-multiplexer wherein a first stage of said tree-multiplexer receives input signals, and a last stage includes a single switching means coupled to an output port;
each of said switching means having a plurality of signal inputs, an output, and a control input means;
wherein the output of each switching means before the last stage drives a respective input of a stage, and the output of the single switching means in said last stage is coupled to said output port;
each of said switching means being operable in a blocking state to force the output of said switching means to a predetermined steady-state logic value in response to a first control signal at the respective control input means; and
each of said switching means being operable in an unblocking state to selectably switch a signal from a selected input of said switching means to the output of said switching means in response to a second control signal at the respective control input means, and in response to output signals from switching means in the preceding stage which are in said blocking state.

18. The switch as recited in claim 17 wherein:
each of said switching means includes a NAND gate;
said first control signal is a logical LOW state signal;
said second control signal is a logical HIGH state signal; and
said predetermined steady-state logic value is a HIGH state signal.

19. The switch as recited in claim 17 wherein each switching means in said first stage comprises:
a pass-transistor selection means having a control input coupled to the respective control input means of said switching means, a plurality of signal inputs each coupled to receive a respective input signal, and an output;
each of said selection means being responsive to said respective control input for selectively switching a signal from a selected one of said signal inputs to the output of said selection means.

20. A broadband switch for switching signals between a plurality of input ports and a plurality of output ports, comprising:
a parallel combination of multiplexing means each having an input end coupled to the input ports, and an output end coupled to a respective one of said output ports;
each of said multiplexing means including a plurality of switching means configured as a multistage tree-multiplexer, wherein for each multiplexing means the first stage serves as the input end and the last stage includes a single switching means which serves as the output end;
for each multiplexing means, each of said switching means having a plurality of signal inputs, an output, and a control input means; wherein the output of each switching means before the last stage drives a respective input of a switching means in the immediately following stage, and the output of the single switching means in said last stage is coupled to said output port;
each of said switching means being operable in a blocking state to force the output of said switching means to a predetermined steady-state logic value in response to a first control signal at the respective control input means; and
each of said switching means being operable in an unblocking state to selectively switch a signal from a selected input of said switching means to the output of said switching means in response to a second control signal at the respective control input means, and in response to output signals from switching means in the preceding stage which are in said blocking state.

21. The broadband switch as recited in claim 20 wherein: each of said switching means includes a NAND gate;
   each first control signal is a logical LOW state signal;
   said second control signal is a logical HIGH state signal; and
   said predetermined steady-state logic value is a HIGH state signal.

22. The broadband switch as recited in claim 20 wherein each switching means in the first stage of at least one multiplexing means comprises:
   a pass-transistor selection means having a control input coupled to the respective control input means of said switching means, a plurality of signal inputs each coupled to receive a respective input signal, and an output;
   each of said selection means being responsive to said respective control input for selectively switching a signal from a selected one of said signal inputs to the output of said selection means.

23. A switch, comprising:
   a plurality of switching means configured as a multistage tree-multiplexer wherein a first stage of said tree-multiplexer receives input signals, and a last stage includes a single switching means coupled to an output port;
   each of said switching means having a plurality of signal inputs, an output, and a control input means;
   wherein the output of each switching means before the last stage drives a respective input of a switching means in an immediately following stage, and the output of the single switching means in said last stage is coupled to said output port;
   each of said switching means being operable in response to a first control condition at the respective control input means to force the output of said switching means to a predetermined steady-state logic value;
   each of said switching means being operable in response to a second control condition at the control input means, and to predetermined steady-state logic value signals received from the preceding stage at signal inputs other than a selected signal input, to provide a switching path from the selected signal input to the output of said switching means.

24. A switch, comprising:
   a plurality of NAND gates arranged into a multistage tree-multiplexer having a last stage with a single NAND gate coupled to an output port;
   each NAND gate in said first stage having a signal input for receiving a respective input signal, an output, and a control input means;
   each NAND gate in the tree-multiplexing stages after the first stage having two signal inputs, an output, and a control input means;
   wherein the output of each NAND gate before the last stage drives a respective input of a NAND gate in an immediately following stage, and the output of the single NAND gate in said last stage is coupled to said output port;
   each of said NAND gates being operable in response to a first control condition at the respective control input means to force the output of said NAND gate to a HIGH steady-state logic value;
   each of said NAND gates after the first stage being operable in response to a second control condition at the control input means, and to a HIGH steady-state logic value signal received from the preceding stage at one signal input, to provide a switching path from the other signal input to the output of said NAND gate.

* * * * *